United States Patent [19]

Müller

[11] 4,336,280
[45] Jun. 22, 1982

[54] METHOD FOR CONTINUOUS PRODUCTION OF NIOBIUM-GERMANIUM LAYERS ON A SUBSTRATE

[75] Inventor: Alfred Müller, Erlangen, Fed. Rep. of Germany

[73] Assignee: Siemens Aktiengesellschaft, Munich, Fed. Rep. of Germany

[21] Appl. No.: 203,968

[22] Filed: Nov. 4, 1980

[30] Foreign Application Priority Data

Dec. 4, 1979 [DE] Fed. Rep. of Germany ....... 2948735

[51] Int. Cl.$^3$ .............................................. B05D 5/12
[52] U.S. Cl. .................... 427/62; 427/124; 427/255.3; 427/255.5; 427/250; 427/251
[58] Field of Search ................ 427/62, 63, 124, 255.1, 427/255.2, 255.3, 255.5, 250, 251

[56] References Cited

U.S. PATENT DOCUMENTS

| | | | |
|---|---|---|---|
| 3,630,769 | 12/1971 | Hart | 427/62 |
| 3,982,049 | 9/1976 | Mee et al. | 427/255.3 |
| 4,005,990 | 2/1977 | Newkirk et al. | 427/62 |
| 4,242,419 | 12/1980 | Dayem et al. | 427/62 |
| 4,253,887 | 3/1981 | Jolly | 156/612 |

OTHER PUBLICATIONS

Kawamura et al., Japanese J. of Applied Physics, vol. 16, No. 11, Nov. 1977, pp. 2037–2041.

Primary Examiner—Norman Morgenstern
Assistant Examiner—Richard Bueker
Attorney, Agent, or Firm—Kenyon & Kenyon

[57] ABSTRACT

A method for producing layers of niobium-germanium on a continuous substrate. The layers are produced in a reaction chamber by the reduction of Nb and Ge which are halogenized by $H_2$ on the substrate which is heated. Uniform high current density of the $Nb_3Ge$ layers throughout the length of the substrate is insured by the addition of a small amount of water vapor which is admixed, in accordance with the invention, to a reaction gas mixture containing $H_2$ gas and Nb and Ge halogenides. The content of water vapor in the reaction gas is maintained between 0.05 and 0.001 volume percent.

8 Claims, 1 Drawing Figure

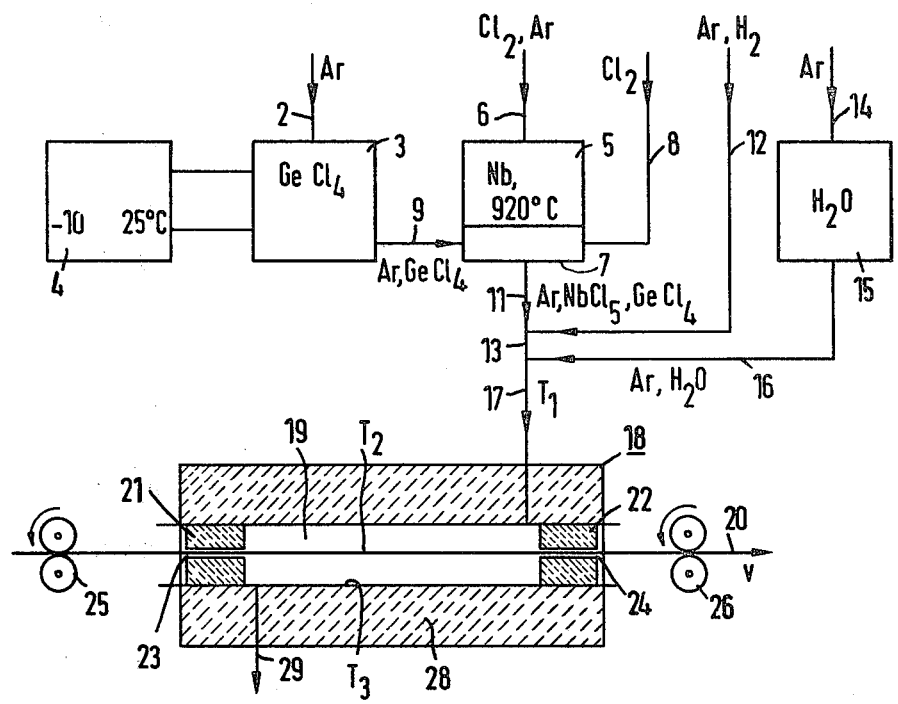

METHOD FOR CONTINUOUS PRODUCTION OF NIOBIUM-GERMANIUM LAYERS ON A SUBSTRATE

BACKGROUND OF THE INVENTION

This invention relates generally to methods for producing layers on substrates, and more particularly, to a method for continuously producing layers with intermetallic superconducting A15 phase niobium-germanium ($Nb_3Ge$) by the reduction of gaseous halogenides of niobium and germanium.

A method for producing layers of $Nb_3Ge$ on a heated substrate by supplying a gas mixture containing hydrogen and the niobium and germanium halogenides to a reaction chamber through which an elongated substrate is pulled is described in "Journal of the Less-Common Metals", Vol. 59, 1978, pp. 35–41. A technique for preparing superconducting A15 phase niobium-germanium ($Nb_3Ge$) using chemical vapor deposition (CVD) technology is disclosed in "LEEE Transaction on Magnetics", Vol. MAG-14, No. 5, September 1978, pp. 608–610; and Vol. MAG-15, No. 1, January 1979, pp. 516–519. The technique described therein has been used for preparing the intermetallic superconducting compound niobium-tin ($Nb_3Sn$) as described in "RCA Review" Vol. XXV, September 1964, pp. 342–365. According to the techniques described in these references, intermetallic A15 phase $Nb_3Ge$ can be precipitated by reduction of gaseous niobium and germanium halogenides, with hydrogen, on a heated substrate of illustratively copper or steel.

As noted in "Journal of the Less-Common Metals", the known production methods have not permitted the manufacture of superconductors which exceed approximately 20 meters in length. If such known methods are applied to the production of long conductor sections, illustratively, in excess of 100 meters, such long conductors will be characterized by a critical current density which drops steeply with increasing conductor lengths. Thus, although such conductors will have layer thicknesses and critical temperature characteristics which deviate over their length by less than 10%, the critical current density characteristic will decrease so as to be only 25% of the initial value at the end of a conductor ribbon which is 150 meters long. Such a decrease in the critical current density cannot be prevented even if the conductor is carefully prepared, and even if the germanium and niobium are deposited over deposition times of several hours with constant mass flow on a substrate which is transported with constant velocity through an atmosphere of a reaction gas mixture which is held at a constant temperature.

It is, therefore, an object of this invention to provide a method for precipitating superconducting A15 phase $Nb_3Ge$ from the gaseous phase, onto conductors which exceed 100 meters in length, without incurring a steep drop in the critical current density characteristic as conductor length increases.

SUMMARY OF THE INVENTION

The foregoing and other objects are achieved by this invention which provides a method of depositing a layer of superconducting A15 phase $Nb_3Ge$ onto substrates which exceed 100 meters in length by providing a small amount of water vapor which is admixed to the gas mixture containing the reducing hydrogen and the niobium and germanium halogenides. The total volume percent of water vapor in the gas mixture may be between 0.05 and 0.001 percent, in a reaction chamber.

In addition to containing superconducting intermetallic A15 phase $Nb_3Ge$, the layer which is deposited on the substrate also contains tetragonal phase $Nb_5Ge_3$. The critical current density of the layer depends on the structure of this two-phase layer. A major advantage of the inventive method described herein over known methods described hereinabove, is that the addition of a small amount of water to the reaction gas atmosphere in the reaction chamber produces a deposition having a uniformly fine crystalline structure. The small amount of water permits the formation of crystallization nuclei, which is required to form and stabilize the fine crystalline structure. This structure insures that long conductor lengths will possess uniform high current density.

BRIEF DESCRIPTION OF THE DRAWING

Comprehension of the invention is facilitated by reading the following detailed description in conjunction with the annexed drawing in which is shown a schematic and block and line representation of an apparatus for coating substrates with superconducting A15 phase $Nb_3Ge$, in accordance with the principles of the invention.

DETAILED DESCRIPTION

The apparatus shown in the FIGURE for producing superconductors in accordance with the present invention correspond in large measure to the apparatus which is generally used with the CVD technique for producing $Nb_3Ge$ in accordance with known chemical reactions. As shown in the FIGURE, germanium tetrachloride ($GeCl_4$) which is required for the reaction is carried by a stream 2 of argon. The argon is saturated with $GeCl_4$ as it flows through a bath 3 containing liquid $GeCl_4$. The temperature of bath 3 is held constant within a range between $-10°$ and $+25°$ C., by a thermostat 4. It is essential that the carrier gas argon be saturated with $GeCl_4$.

Niobium pentachloride ($NbCl_5$), which is required for the coating process, is formed by the chlorination of solid niobium granulate 5, at a temperature of approximately 920° C. A stream 6 of chlorine and argon gas flows through a tank filled with niobium granulate 5 and is completely reacted to $NbCl_5$. The composition of the reaction product can be determined from the consumption of niobium and chlorine, which corresponds to niobium tetrachloride ($NbCl_4$). Additional chlorination of $NbCl_4$ produces a stable but highly volatile pentachloride of niobium. A mixing chamber 7 is provided which is connected to the tank containing niobium granulate 5. In this chamber, $NbCl_4$ is subjected to the further chlorination by a stream 8 of chlorine gas, wherein a complete reaction is assured. Mixing chamber 7 further receives argon stream 9 which is saturated with $GeCl_4$.

Mixing chamber 7 discharges a gas stream 11 comprised of a mixture of Ar, $NbCl_5$ and $GeCl_4$. This gas mixture is subsequently admixed with a gas stream 12 of hydrogen ($H_2$) and Ar as a carrier gas. This produces a gas stream 13 composed of $NbCl_5$, $GeCl_4$, $H_2$ and Ar; which are further admixed, according to the invention, with small amounts of water. The admixing with water is achieved by providing a stream 14 of Ar gas which is fed into a chamber 15 wherein water vapor is added. Argon stream 16 is saturated with water vapor and is combined with gas stream 13 so as to produce a gas stream 17 which is conducted to a coating device 18. Prior to entering coating device 18, gas stream 17 is heated to a temperature $T_1$ which may be approximately 550° C. Since gas stream 17 flows with a high velocity, there is no danger of a reaction between the components of the reaction gas mixture during the short time prior to entry into coating device 18.

Coating device 18 contains an elongated reaction chamber 19 through which is transported a substrate 20, which may be in the form of a wire or ribbon, which is to be coated. The substrate, which may exceed 100 meters in length, is pulled through reaction chamber 19 as a predetermined velocity v. Substrate 20 may be a ribbon of material known under the trade name of "Hastelloy B" (nickel, alloyed with Mo, Co and Fe) or a steel ribbon.

Substrate 20 enters reaction chamber 19 through an opening 23 of a lock 21, and exits through an opening 24 of a lock 22. Locks 21 and 22 are located on opposite ends of reaction chamber 19. The section of substrate 20 which extends through reaction chamber 19 must be heated to a predetermined temperature $T_2$ of, for example, 900° C. This heating may be advantageously accomplished by passing a current through the substrate. Contact elements 25 and 26, which may be in the form of roller-shaped graphite contacts, are arranged outside of coating device 18 for conducting a current through substrate 20.

Reaction gas stream 17 which is preheated to the temperature $T_1$ is introduced into reaction chamber 19 at a high rate of flow of approximately 5 to 13 meters per second. Since the reaction gas mixture cannot be heated sufficiently by the temperature $T_2$ of substrate 20, to achieve the desired reaction, reaction chamber 19 is additionally heated by a furnace 28 to a temperature $T_3$. Furnace 28 surrounds reaction chamber 19. Reaction chamber 19 communicates with the outside by means of locks 21 and 22, and an exhaust gas line 29.

The cross-sectional dimensions of the apparatus indicated in the FIGURE are advantageously adapted to the desired flow velocities and throughput of the starting materials. The metal chloride in a reaction gas flow of approximately 20-50 mol per hour, constitute approximately 1 mol percent, approximately 40% of which contributes to the coating. The concentration of the water vapor which is admixed to gas mixture 13, according to the invention, is between 0.05 and 0.001 volume percent, and preferably between 0.003 and 0.03 volume percent of the reaction gas mixture. This corresponds to between 0.3 and 3 mol percent, with respect to the total of the metal chloride in the reaction gas mixture. Even with such a low concentration of water vapor, a constant critical current density for the intermetallic compound $Nb_3Ge$ may be precipitated on substrate 20 over long conductor lengths.

In a further embodiment of the invention, ribbon conductors having $Nb_3Ge$ may be produced in apparatus made of quartz glass by CVD technology. In this embodiment, the length of reaction chamber 19 is approximately 75 cm, and its cross-section is approximately 0.85 cm². A gas inlet and a gas outlet are provided at opposite ends thereof. Locks 21 and 22, as shown in the FIGURE, having openings 23 and 24, are provided at the respective ends. Openings 23 and 24 are matched to the dimensions of substrate 20 which is to be conducted therethrough. The locks may be in the form of chambers which are flushed with rare gas, and which are closed with graphite. Water-cooled brass cylinders having openings adapted to the dimensions of the substrate may also be provided. The apparatus is heated by a plurality of heated furnaces 28, located in different sections.

In this embodiment, a mixture of Ar, $H_2$, $NbCl_5$ and $GeCl_4$ are throughput at the following rates: Ar, 5.31 mol/h; $H_2$, 16.85 mol/h; $NbCl_5$, 0.145 mol/h; and $GeCl_4$, 0.53 mol/h. The above gas mixture arrives at reaction chamber 19 with a temperature $T_1$ of approximately 450° C., and flows through it with a velocity of approximately 5 m/sec. In a first embodiment A, the water content of the gas mixture is not controlled, and is less than 0.001 volume percent without the addition of moisture. In a second embodiment B, the reaction gas mixture is humidified in a simple manner by means of a water vapor-saturated argon stream. The additional water throughput in embodiment B is 0.66 mmol/h.

In both embodiments A and B, substrate 20 is a Hastelloy ribbon which is 2 mm wide and 50 microns thick. The ribbon is pulled through the reaction chamber with a velocity v of 30 cm/min and is heated by electric current to a temperature $T_2$ of approximately 860° C.

The ribbon conductors A and B were each produced at a length of 145 meters under equal conditions, except that ribbon conductor B received additional humidification.

TABLE

| Measuring Point [m] | Conductor A | | Conductor B | |
| --- | --- | --- | --- | --- |
| | $T_{c,0.5}$ [K] | $I_{c,5T}$ [$10^5 Acm^{-2}$] | $T_{c,0.5}$ [K] | $I_{c,5T}$ [$10^5 Acm^{-2}$] |
| 2 | 19.9 | 5.7 | 20.7 | 4.9 |
| 19 | 19.9 | 3.3 | 20.6 | 5.0 |
| 36 | 19.0 | 2.9 | 20.5 | 4.8 |
| 54 | 18.2 | 2.7 | 19.7 | 4.4 |
| 71 | 18.0 | 2.4 | 20.6 | 5.0 |
| 88 | 16.0 | 1.1 | 20.2 | 4.8 |
| 105 | 16.7 | 1.8 | 20.1 | 4.8 |
| 122 | 16.3 | 2.0 | 20.1 | 4.8 |
| 145 | 16.6 | 1.6 | 20.5 | 4.9 |
| Mean Value | 17.8 | 2.6 | 20.3 | 4.8 |
| Mean Value of deviation (%) | 1.5 (8.5) | 1.4 (51.5) | 0.3 (1.6) | 0.2 (3.7) |

The column identified "Measuring Point [m]", indicates the points along the lengths along the respective conductors at which measurements were made. The columns identified as "$T_{c,0.5}$" refer to critical temperature at the center of the transition from the superconducting to the normal conducting state. The columns identified as "$I_{c,5T}$" correspond to the critical current density of the niobium-germanium layers at the magnetic induction of 5 Tesla, and a temperature of 4.2° K.

The Table shows that Conductor B, which is coated by the method in accordance with the invention, maintained a relatively constant critical current density throughout its length, contrary to the Conductor A. In the specific illustrative embodiment, water vapor was introduced into the gas mixture prior to entering the reaction chamber. However, the addition of water vapor may be performed in the reaction chamber.

Although the invention has been described in terms of specific embodiments and applications, it is to be understood that persons of skill in the art can make additional embodiments for other applications, without departing from the scope of the inventions. Thus, although the embodiment example was based upon the formation of superconducting intermetallic compound Nb$_3$Ge from specific chlorides of niobium and germanium, other halogenides of these elements known from CVD technology may be used. Accordingly, it is to be understood that the drawings and descriptions of the invention herein are illustrative and are not to be construed in a limiting sense.

What is claimed is:

1. A method for continuously producing layers of intermetallic superconducting A15 phase niobium-germanium Nb$_3$Ge by hydrogen reduction of gaseous halogenides of niobium and germanium, the method having the step of depositing the layers upon a heated substrate by conducting a gas mixture having hydrogen and niobium and germanium halogenides to a reaction chamber through which the substrate is conducted, CHARACTERIZED IN THAT the heated substrate to be layered exceeds 100 meters in length and there is further provided the step of mixing water vapor with the gas mixture of hydrogen and niobium and germanium halogenides so as to produce an atmosphere in the reaction chamber having between 0.05 and 0.001 volume percent of water vapor.

2. The method of claim 1 wherein said atmosphere in the reaction chamber contains between 0.03 and 0.003 volume percent of water vapor.

3. The method of claim 1 wherein there is provided the further step of conducting a stream of argon gas which is saturated with said water vapor with the gas mixture.

4. The method of claim 3 wherein there is further provided the further step of mixing said argon stream which is saturated with said water vapor with the gas stream containing hydrogen and niobium and germanium halogenides, said argon stream and the stream of hydrogen and niobium and germanium halogenides being admixed outside of the reaction chamber so as to produce a reaction gas stream which is introduced into the reaction chamber.

5. The method of claims 1, or 2 wherein there is provided the further step of conducting said water vapor directly into the reaction chamber.

6. The method of claim 4 wherein there is provided the further step of preheating said reaction gas mixture containing hydrogen, and niobium and germanium halogenides and water vapor, before being conducted into the reaction chamber.

7. The method of claim 1 wherein there is provided the further step of heating said atmosphere in the reaction chamber by at least one heating means in the reaction chamber.

8. The method of claim 1 wherein the substrate in the reaction chamber is heated by conduction of an electric current.

* * * * *